(12) United States Patent  
Sunairi (10) Patent No.: US 7,719,113 B2  
(45) Date of Patent: May 18, 2010

(54) SEMICONDUCTOR DEVICE INCLUDING DUMMY PATTERNS

(75) Inventor: Souji Sunairi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/262,816

(22) Filed: Nov. 1, 2005

(65) Prior Publication Data

US 2006/0091425 A1    May 4, 2006

(30) Foreign Application Priority Data

Nov. 2, 2004    (JP)    ............................ 2004-319427

(51) Int. Cl.
*H01L 23/48*    (2006.01)
*H01L 23/52*    (2006.01)
(52) U.S. Cl. ....................................... 257/758; 257/773
(58) Field of Classification Search ................. 257/758, 257/773, 776, E23.151
See application file for complete search history.

(56) References Cited

U.S. PATENT DOCUMENTS

| 5,899,706 | A | 5/1999 | Kluwe et al. |
| 5,929,528 | A | 7/1999 | Kinugawa |
| 6,441,456 | B1 | 8/2002 | Konishi et al. |
| 6,498,357 | B2 | 12/2002 | Ker |
| 6,909,189 | B2 | 6/2005 | Nanjo |
| 2002/0061608 | A1 * | 5/2002 | Kuroda et al. ............... 438/129 |

FOREIGN PATENT DOCUMENTS

| JP | 2000-150806 A | 5/2000 |
| JP | 2001-168205 | 6/2001 |
| JP | 2004-153091 A | 5/2004 |

OTHER PUBLICATIONS

Chinese Office Action dated Jul. 20, 2007, with partial English translation.
Chinese Office Action dated Aug. 8, 2008.
Japanese Office Action dated Aug. 28, 2009 with partial English-language translation.
Japanese Office Action dated Dec. 17, 2009 with partial English-language translation.

* cited by examiner

*Primary Examiner*—Hung Vu
(74) *Attorney, Agent, or Firm*—McGinn IP Law Group PLLC (57) ABSTRACT

A semiconductor device in which surge breakdown of inter-layer-insulating film does not occur even when effectively suppressing variations in etching and proximity effects. The semiconductor comprises dummy patterns 7b that are made from a gate layer and shaped to be disposed within the surface shape of the insulating material of element-isolation areas 3a and are located on the insulating material of the element-isolation areas 3a; wherein dummy patterns 7b are located on an underlayer that includes area directly under wiring layers 10a that are located on layers above the gate layer.

3 Claims, 10 Drawing Sheets

SEMICONDUCTOR DEVICE INCLUDING DUMMY PATTERNS

FIELD OF THE INVENTION

This invention relates to a semiconductor device having dummy patterns made from a gate layer, and particularly to a semiconductor device that is capable of obtaining good resistance to electrostatic discharge.

BACKGROUND OF THE INVENTION

In conventional semiconductor devices, in order to effectively suppress variations in etching and proximity effects, as many gate-layer dummy patterns as possible were formed in the chip (see patent documents 1 and 2). In the invention disclosed in patent document 1, in order to suppress variations in etching, dummy patterns were formed between adjacent gates. In the invention disclosed in patent document 2, in order to prevent proximity effects when forming the gate pattern by photolithography, a dummy gate (dummy pattern) was located in a dummy element area that was formed in an element isolation area. This kind of dummy pattern was located on the semiconductor substrate, or above a well having different electric potential than the wiring (a well with identical conductivity type as the substrate).

However, in conventional semiconductor devices, as the film thickness of the insulating film between layers becomes thicker, the aspect ratio of the contact holes and via holes becomes larger and it becomes difficult to put the conductor inside the holes; and as the holes become deeper, there is a possibility that the contact resistance will increase, so the film thickness of the insulating layers between layers is becoming thinner.

[Patent Document 1]
U.S. Pat. No. 5,899,706

[Patent Document 2]
Japanese Patent Kokai Publication No. JP-P2001-168205A

SUMMARY OF THE DISCLOSURE

However, in a conventional semiconductor device, as the film thickness of the insulating layer between layers becomes thinner, the spacing between the wiring and the dummy patterns becomes smaller, and when an electrostatic discharge surge is applied to the pad, it becomes easy for the interlayer insulating film (and gate insulating layer underneath the dummy patterns) between the wiring connected to the pad and the dummy patterns to fail. Therefore, even when effectively suppressing variations in etching and proximity effects (when several gate-layer dummy patterns are formed on the chip surface), it is necessary to improve the electrostatic discharge resistance so that surge breakdown of the interlayer insulating film does not occur. Therefore, there is much to be desired in the art.

In a first aspect of the invention, a semiconductor device comprises dummy patterns that are made from a gate layer and shaped to be disposed within a surface shape of an insulating material of element-isolation areas, and are located on the insulating material.

In a second aspect of the invention, a semiconductor device comprises dummy patterns that are made from a gate layer and shaped such that they are disposed within the surface shape of a well having a conductance type that is opposite that of the semiconductor substrate, and are located on the well.

In a third aspect of the invention, a semiconductor device comprises dummy patterns that are made from a gate layer and shaped to be disposed within a surface shape of a semiconductor substrate, the dummy patterns being located on the semiconductor substrate; wherein the dummy patterns are located on an underlayer that includes an area directly under wiring of a wiring layer that has a higher layer location than an undermost wiring layer of wiring of (a plurality of) wiring layers above the gate layer, or are located on an underlayer that includes an area directly under wiring of a wiring layer that is separated from the surface of the semiconductor substrate by 0.7 μm or more.

In a fourth aspect of the invention, a semiconductor device comprises dummy patterns that are made from a gate layer, the dummy patterns being located in locations, from among the entire gate layer area, located directly under wiring of an undermost wiring layer of wiring of a plurality of wiring layers located higher than the gate layer, or directly under wiring of a wiring layer that is separated from a surface of a semiconductor substrate by a distance of less than 0.7 μm, provided that the dummy patterns are located in part of locations that are directly above an insulating material of an element-isolation area, and directly above a well having a conductance type that is opposite that of the semiconductor substrate.

The term "directly under" and "directly above" used herein refer to the relative overlapping positional relationship in a projected view viewed along a normal axis of a plane.

The meritorious effects of the present invention are summarized as follows.

According to the present invention (Aspects 1 to 4), it is possible to prevent breakdown of the interlayer-insulating film between the dummy gates and wiring, and to obtain good resistance to electrostatic discharge, even when electrostatic discharge surge is applied to the pad.

According to the first aspect of the present invention, with the insulating material of the element-isolation areas, it is possible to enlarge the distance between the wiring and the semiconductor substrate, so surges are alleviated and it is possible to obtain good resistance to electrostatic discharge.

According to the second aspect of the present invention, parasitic capacitance is formed between the wells and semiconductor substrate, so surges are alleviated, and it is possible to obtain good resistance to electrostatic discharge.

According to a specific embodiment of the first and second Aspects of the present invention, by maintaining space (distance) between the wiring and semiconductor substrate, surges are alleviated, and it is possible to obtain good resistance to electrostatic discharge.

PREFERRED EMBODIMENTS OF THE INVENTION

Embodiment 1

Figure 1:
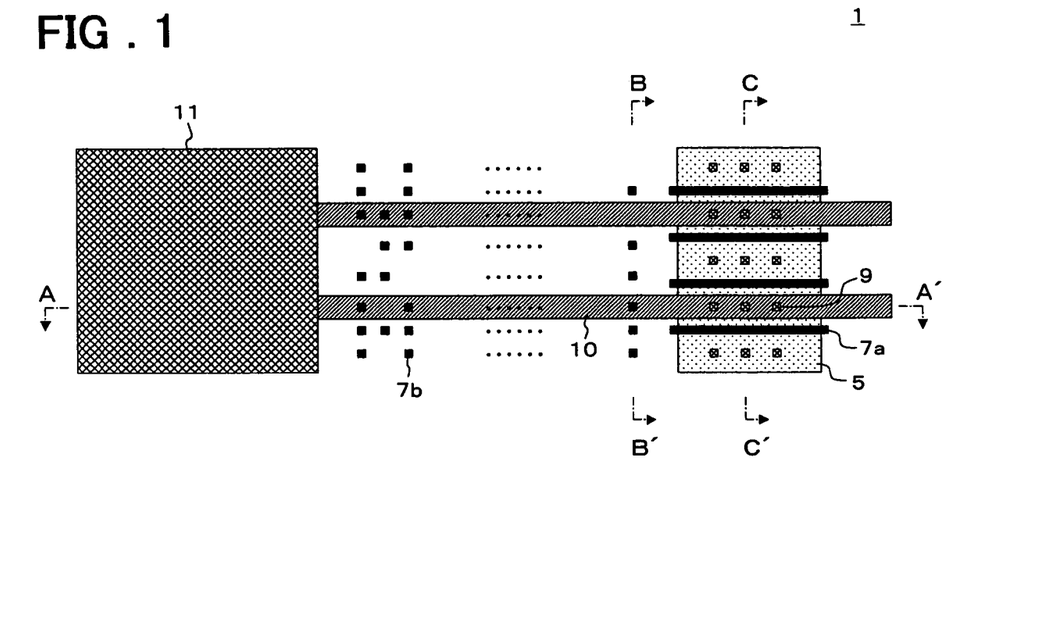
FIG. 1 is a partial plan view that shows the construction of the semiconductor device of a first embodiment of the invention.
Figure 2:
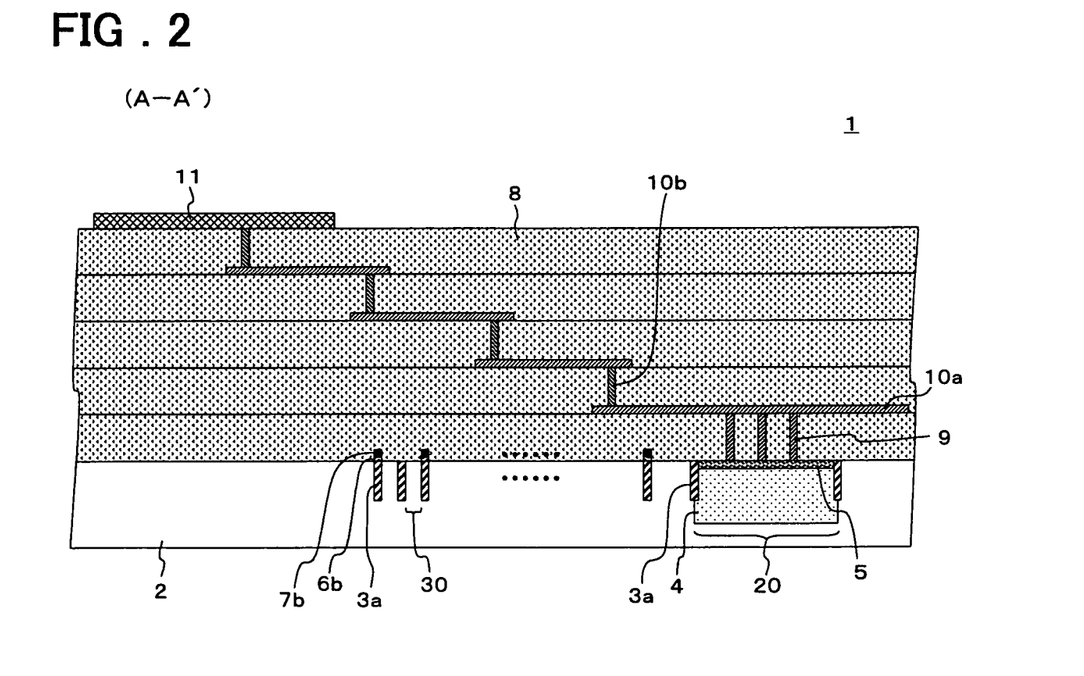
FIG. 2 is a partial cross-sectional view of the section A-A' that shows the construction of the first embodiment of the invention.
Figure 3:
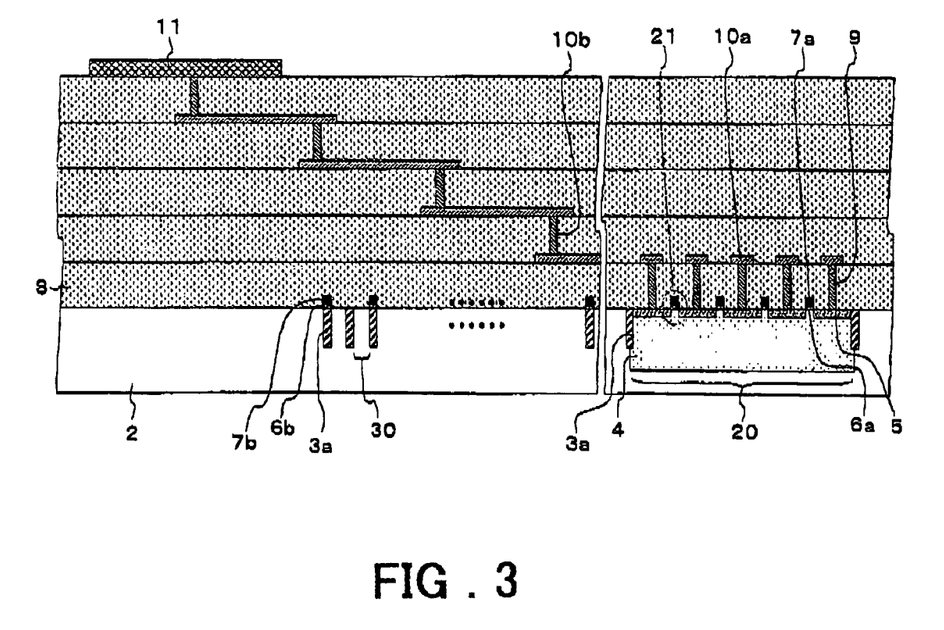
FIG. 3 is a partial cross-sectional view of the section B-B' that shows the construction of the first embodiment of the invention.
Figure 4:
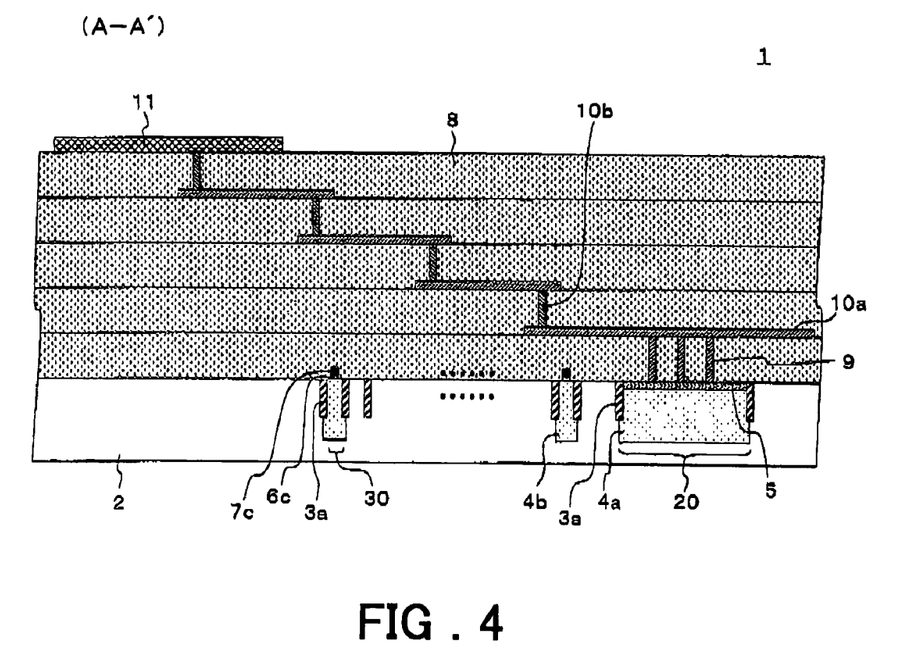
FIG. 4 is a partial cross-sectional view of the section C-C' that shows the construction of the first embodiment of the invention.

A semiconductor device of a first embodiment of the invention will be explained using the drawings. FIG. 1 is a partial plan view that shows the construction of the semiconductor device of this first embodiment of the invention. FIG. 2 is a partial cross-sectional view of the section A-A' that shows the construction of the first embodiment of the invention. FIG. 3 is a partial cross-sectional view of the section B-B' that shows the construction of the first embodiment of the invention. FIG. 4 is a partial cross-sectional view of the section C-C' that shows the construction of the first embodiment of the invention.

The semiconductor device 1 of this first embodiment comprises dummy patterns 7b that are made from a gate layer and are shaped such that they are disposed (or fit) inside the surface shape (profile, top surface area) of the insulating material of element-isolation areas 3a, and are located above that insulating material (directly above the element-isolation areas 3a). Here, the surface shape of the insulating material of the element-isolation areas 3a is the shape of the insulating material of the element-isolation areas 3a as seen from a direction normal to the plane of the substrate. The element-isolation areas 3a are formed on the semiconductor substrate 2 (see FIGS. 2 to 4). There is a protection-element area 20 and dummy-element area 30 formed between element-isolation areas 3a. A well 4 is formed in the protection-element area 20 (see FIGS. 2 and 4). Gate insulating film 6a is formed above the channel areas in the protection-element area 20. Gates 7a are formed on the gate-insulating film 6a. Diffusion layers 5 are formed on the outside of both sides of the channel areas. Dummy-insulating film 6b is formed above the element-isolation areas 3a that are located around the dummy-element area 30 (see FIGS. 2 and 3). Dummy patterns 7b are formed on the dummy-insulating film 6b. The dummy patterns 7b are formed such that they are disposed (or fit) inside the surface shape of the insulating material of the element-isolation areas 3a, and are located directly above the insulating material of the element-isolation areas 3a. The dummy patterns 7b are located in an underlayer that includes the region directly under the wiring 10 (i.e. the projected region of the wiring 10 under the wiring 10). A plurality of interlayer insulting films 8 are layered on the semiconductor substrate 2, diffusion layers 5, gates 7a and dummy patterns 7b (see FIGS. 2 to 4). Contacts 9 that connect with the diffusion layers 5 and wiring 10 that connects the contacts 9 with the pad 11 are formed in the interlayer insulating films 8 (see FIGS. 1 and 2). The wiring 10 is connected to a plurality of wiring layers 10a inside the interlayer insulating films 8 by way of via holes 10b.

The semiconductor substrate 2 is N-type silicon substrate or P-type silicon substrate. The element-isolation areas 3a are areas formed on the semiconductor substrate 2 that electrically isolate a plurality of device-active areas (electrostatic discharge protection elements, dummy elements, etc.). The element-isolation areas 3a comprise insulating material (for example, silicon-oxide film) and are located at a specified depth in locations that surround the device-active areas. The element-isolation areas 3a can have STI structure or LOCOS structure. The well 4 is an area in which P-type or N-type impurities (for example, boron ions as P-type impurities) are diffused to a specified depth in the semiconductor substrate 2 for each device active area. The diffusion layers 5 are layers that become the source/drain areas in which impurities (for example, arsenic ions in the case of N-type impurities) are diffused. Insulating film such as silicon-oxide film, silicon-nitride film, nitride-oxide film, and high-dielectric-constant film is used for the gate-insulating film 6a and dummy-insulating film 6b. Gates 7a and dummy patterns 7b are made from a gate layer for which polysilicon or the like is used. The dummy patterns 7b can also be placed in an area projected directly under the pad 11. The dummy patterns 7b can also be located in the underlayer including an area directly below the undermost wiring layer 10a (wiring layer that is separated 0.7 µm or less from the surface of the semiconductor substrate). Insulating film such as an inorganic insulating film like silicon-oxide film, organic insulating film, and/or Low-k film is used for the interlayer insulating films 8. Conductive material such as Al, W, Cu and polysilicon is used for the contacts 9, wiring 10, wiring layers 10a, via holes 10b and pad 11. The wiring 10 is such that it connects the pad 11 with electrostatic discharge protection elements 21 (diffusion layers 5), however, it does not need to connect them. The pad 11 includes either the cases input pad, output pad or input/output pad. The pad 11 can be formed at a location disposed above the protection-element layer 20, or can be formed at a location that is separated from the protection-element area 20. The electrostatic discharge protection elements 21 that are formed in the protection-element area 20 may include input-protection elements, output-protection elements, input/output-protection elements, and high-breakdown-voltage-protection elements.

Next, the method for manufacturing the semiconductor device of a first embodiment of the invention will be explained with reference to the drawings. FIGS. 5 to 9 are partial cross-sectional views of the process steps showing the manufacturing method for the semiconductor device of this first embodiment of the invention. FIGS. 5 to 9 show a cross section corresponding to section A-A' in FIG. 1, however, for convenience, a cross section corresponding to section C-C' in FIG. 1 is shown for the protection-element area 20.

Figure 5A:
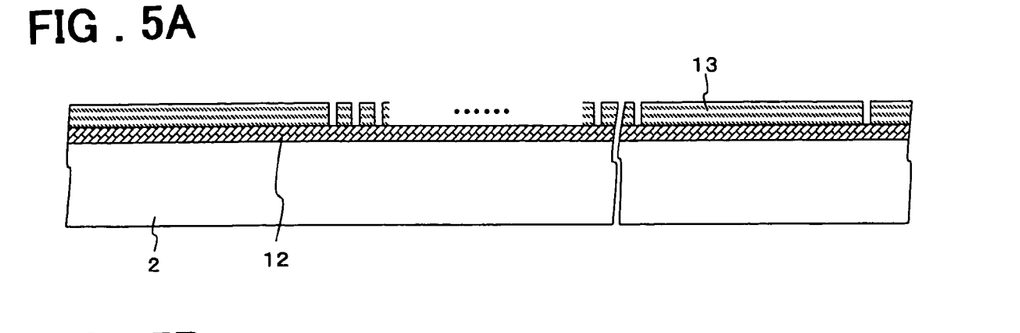
FIGS. 5A and 5B are partial cross-sectional views of a first process showing the manufacturing method of the semiconductor device of the first embodiment of the invention.

First, a silicon-oxide/nitride film 12, comprising sequentially layered silicon-oxide film and silicon-nitride film, is formed on the surface of the semiconductor substrate 2 (for example, a P-type silicon substrate), and photoresist 13, which is used for forming the element-isolation areas by photolithography, is formed on the top thereof that (step A1; see FIG. 5A).

Figure 5B:
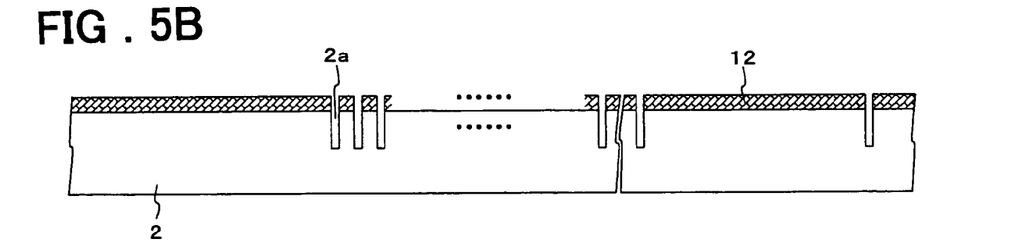

Next, using the photoresist (see 13 in FIG. 5A) as a mask, the silicon-oxide/nitride film 12 is selectively etched, and after the photoresist has been removed, the silicon-oxide/nitride film 12 is used as a mask and the surface of the semiconductor substrate 2 is etched down to a specified depth to form narrow trenches 2*a* (STI trench) (step S2; see FIG. 5B).

Figure 6A:
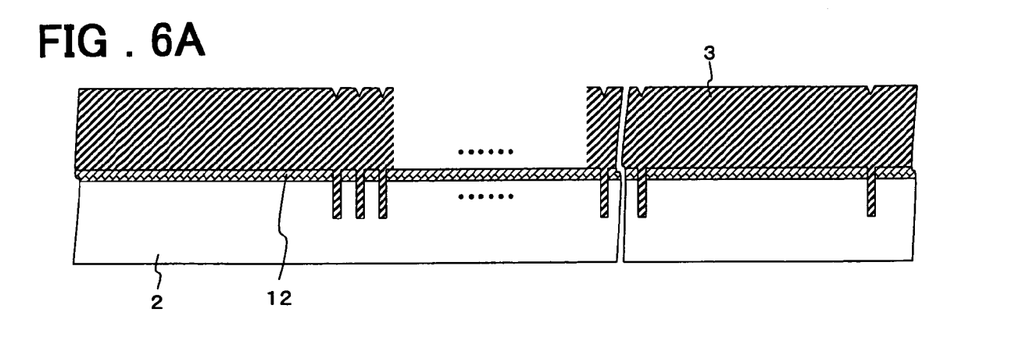
FIGS. 6A and 6B are partial cross-sectional views of a second process showing the manufacturing method of the semiconductor device of the first embodiment of the invention.

Next, an insulating layer 3 (silicon-oxide film) having a thickness sufficient for completely embedding the trenches (see 2*a* in FIG. 5B) is deposited to grow on the surface of the semiconductor substrate 2 by the CVD method (step A3; see FIG. 6A).

Figure 6B:
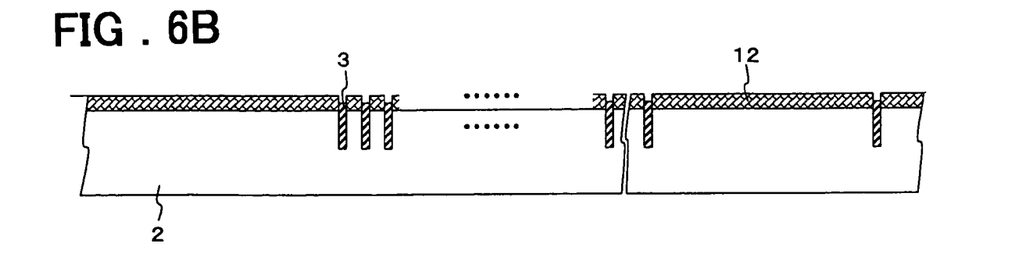

Next, with the silicon-oxide/nitride film 12 as a stopper, the insulating film 3 is polished using a chemical-mechanical-polishing method (CMP method) to flatten the surface (step A4; see FIG. 6B).

Figure 7A:
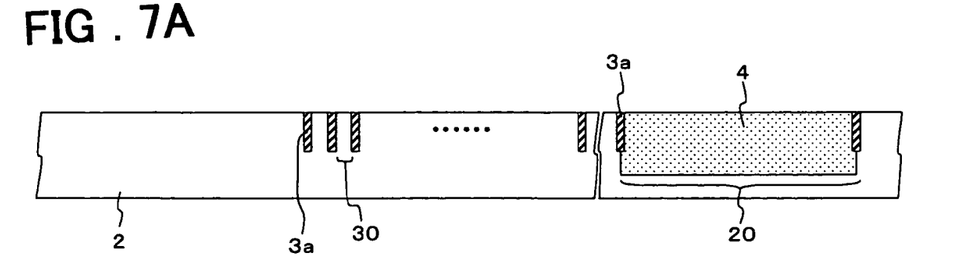
FIGS. 7A and 7B are partial cross-sectional views of a third process showing the manufacturing method of the semiconductor device of the first embodiment of the invention.

Next, the insulating film (see 3 in FIG. 6B) on the surface of the silicon-oxide/nitride film (see 12 in FIG. 6B) and the semiconductor substrate 2 is completely removed, and a well 4 (for example N-type well), having a specified depth, is formed by implanting impurity into the semiconductor substrate 2 of the protection-element area 20 (step A5; see FIG. 7A). By doing this, element-isolations areas 3*a* embedded with an insulating material are formed only in the trenches (see 2*a* in FIG. 5B), and the protection-element area 20 and dummy-element areas 30 are partitioned off (isolated) and formed by the element-isolation areas 3*a*, respectively. The well 4 can be selectively formed on the semiconductor substrate of the protection-element area 20 by covering the entire areas except the protection-element areas 20 with a photoresist and implanting impurities into the semiconductor substrate by ion implantation. The dummy-element area(s) 30 is(are) used for maintaining the flatness of the substrate surface when performing polishing in the CMP process. Here, impurities were not implanted into the semiconductor substrate 2 of the dummy-element area 30, however, impurities could be implanted.

Figure 7B:
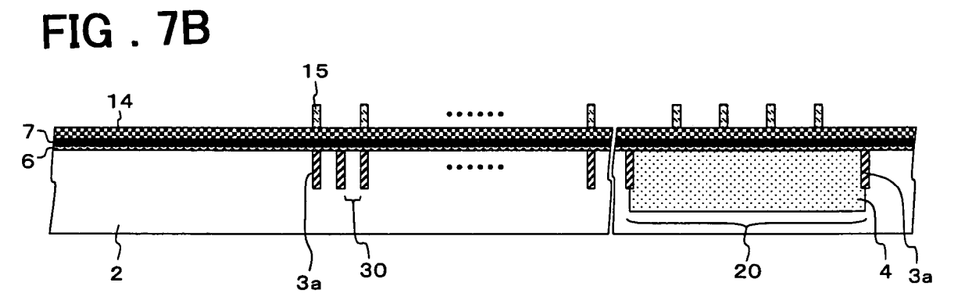

Next, insulating film 6 to be used for forming the gate-insulating film is formed on the surface of the semiconductor substrate, and the gate layer 7 (polysilicon) is formed on the insulating film 6 as the gate material, an anti-reflection film 14 is formed on the gate layer 7, and furthermore, a photoresist 15 to be used for forming the gates and dummy patterns is formed on the top of the anti-reflection film 14 (step A6: see FIG. 7B). When doing this, a plurality of sections of photoresist 15 (here 4 sections) to be used for forming the gate patterns are arranged in a row on the top of the protection-element area 20, and photoresist 15 to be used for forming dummy patterns is arranged on the top of the specified element-isolation areas 3*a* that are arranged surrounding the dummy-element area 30. Also, a specified number of sections of photoresist are placed on the normal-element areas (not shown in the figures). Therefore, in the gate patterns on the protection-element area 20 (see 7*a* in FIG. 8A), and the gate patterns on the normal-element areas (not shown in the figures), by having the dummy patterns (see 7*b* in FIG. 8A) exist in adjacent areas, the space (interval) between the gate patterns on the protection-element area 20, and the space (interval) between gate patterns on the normal-element areas become nearly uniform. This makes it difficult for etching variations to occur when exposing and developing the photoresist 15 that is used for forming the gates and dummy patterns, and even though proximity effects may occur, it is possible to form uniform gate lengths in the photoresist 15 that corresponds to the protection-element area 20 and normal-element areas (not shown in the figure). Here, the photoresist 15 is arranged on the top of part of the element-isolation areas 3*a* that surround the dummy-element area 30, however, it is also possible to arrange photoresist 15 on the top of all of the element-isolation areas 3*a* that surround the dummy-element area 30.

Figure 8A:
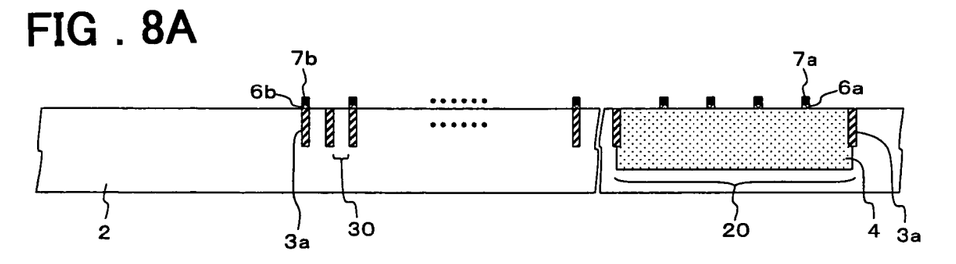
FIGS. 8A and 8B are partial cross-sectional views of a fourth process showing the manufacturing method of the semiconductor device of the first embodiment of the invention.

Next, using the photoresist (see 15 in FIG. 7B) as a mask, the anti-reflection film (see 14 in FIG. 7B), the gate layer (see 7 in FIG. 7B), and insulating layer (see 6 in FIG. 7B) are etched in that order, and by removing the anti-reflection film 14, gates 7*a*, dummy patterns 7*b*, gate-insulating films 6*a* and dummy-insulating films 6*b* are formed (step A7; see FIG. 8A). Here, the gates 7*a* are formed such that a plurality of gates are arranged in a row on gate-insulating films 6*a*, respectively, on the protection-element area 20. The dummy patterns 7*b* are formed on the top of the dummy-insulating films 6*b* disposed on the top of the element-isolation areas 3*a*.

Figure 8B:
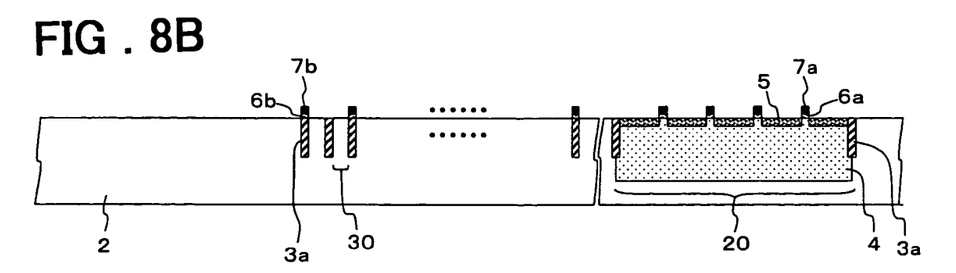

Next, an impurities (for example, P-type impurities) are implanted by ion implanting on the entire surface of the element-isolation areas 3*a* and dummy-element area 30 that are masked with photoresist or the like, and diffusion layers 5 that will become the source/drain areas are formed on the protection-element area 20 by a self-alignment method that uses the gates 7*a* (step A8; see FIG. 8B).

Figure 9:
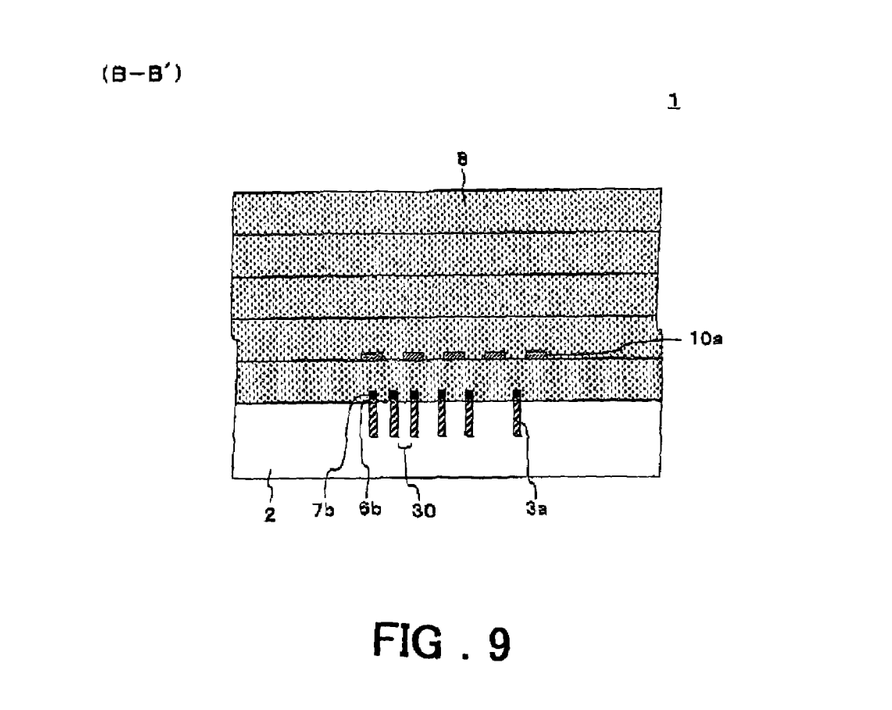
FIG. 9 is a partial cross-sectional view of a fifth process showing the manufacturing method of the semiconductor device of the first embodiment of the invention.

Next, an interlayer-insulating film 8 is formed over the entire surface of the semiconductor substrate 2, including the gates 7*a*, dummy patterns 7*b* and diffusion layers 5, then contact holes are formed in the interlayer-insulating film 8 such that they pass through to the diffusion layers 5, and contacts 9 are formed inside these contact holes 8*a*, after which the formation of a set of a wiring layer 10*a*, another interlayer-insulating film 8, via hole and via 10*b* is repeated to form a plurality of such sets, and finally the pad 11 is formed on the top of the via 10*b* and the uppermost interlayer-insulating film 8 (step A9; see FIG. 9). By doing this, together with being connected to the pad 11 and electrostatic discharge protection elements 21(diffusion layers), wiring is formed in which a plurality of wiring layers 10*a* are connected by vias 10*b*.

With this first embodiment, the distance between the wiring 10 and semiconductor substrate 2 is separated by the element-isolation areas 3*a*, so it becomes difficult for breakdown of the interlayer-insulating film 8 to occur, and surges are alleviated, thus it is possible to obtain good resistance to electrostatic discharge.

Embodiment 2

Figure 10:
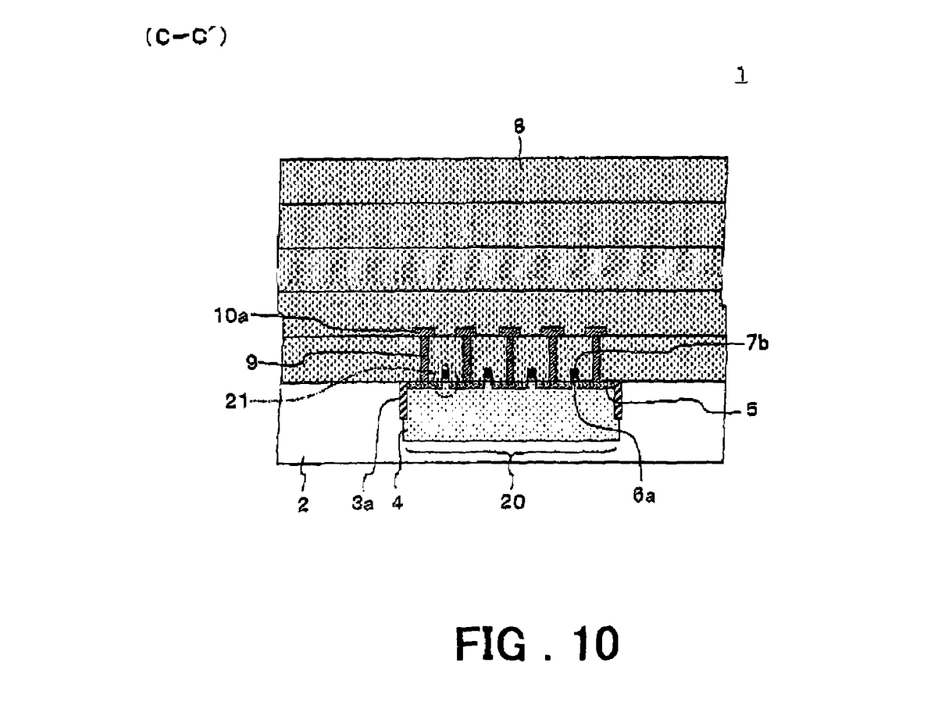
FIG. 10 is a partial cross-section view (corresponding to section A-A' in FIG. 1) showing the construction of the semiconductor device of a second embodiment of the invention.
Figure 11:
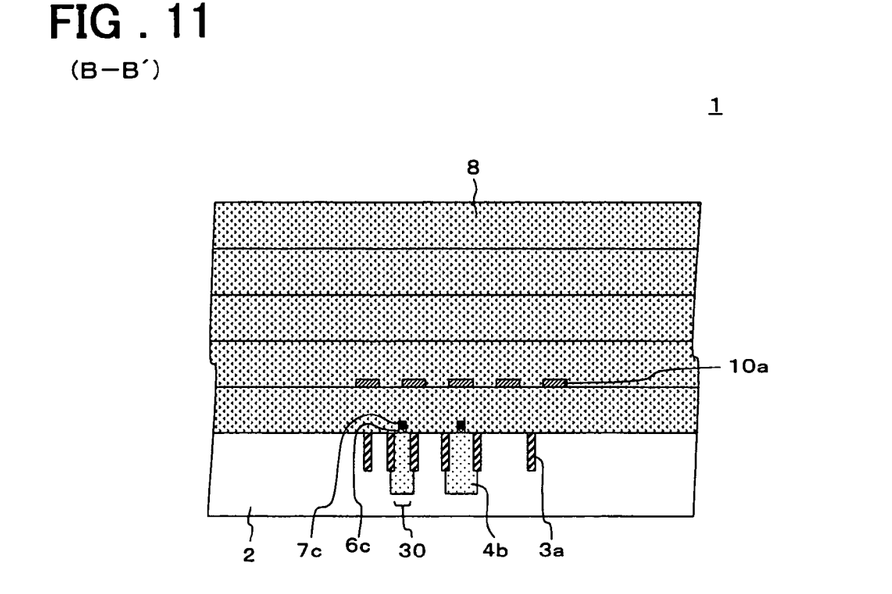
FIG. 11 is a partial cross-section view (corresponding to section B-B' in FIG. 1) showing the construction of the semiconductor device of a second embodiment of the invention.

Next, the semiconductor device of a second embodiment of the invention will be explained using the drawings. FIGS. 10 and 11 are partial cross-sectional views showing the construction of the semiconductor device of this second embodiment of the invention. FIG. 10 is a cross-sectional view that corresponds to the section A-A' in FIG. 1, and FIG. 11 is a cross-sectional view that corresponds to the section B-B' in FIG. 1.

The semiconductor device 1 of this second embodiment comprises dummy patterns 7c that are made from a gate layer and located on the top of a well 4b having conductance type that is opposite that of the semiconductor substrate 2, and are shaped such that they are disposed inside the surface shape of the well 4b. Here, the surface shape of the well 4b is the shape of the well 4b as seen from the direction normal to the plane of the substrate. The well 4b having a conductance type that is opposite that of the semiconductor substrate 2 is formed in a specified dummy-element area 30. Dummy-insulating films 6c are formed on the top of the well 4b. The dummy patterns 7c are formed on the top of the dummy-insulating films 6c. The dummy patterns 7c are formed in a shape such that they can be disposed inside the surface shape of the well 4b, and are located directly on the top of the well 4b. The dummy patterns 7c are located on an underlayer that includes the area directly underneath the wiring 10. The dummy patterns 7c can also be located on an underlayer that includes an area directly under the undermost wiring layer 10a (wiring layer separated by a distance of less than 0.7 µm from the surface of the semiconductor substrate). The other construction is the same as that in the first embodiment. Here, the well 4a is an area in which P-type or N-type impurity (for example, boron ions as P-type impurities) are diffused up to a specified depth inside the semiconductor substrate 2 for each device active area. On the other hand, the well 4b may have the same conducting type impurities as the well 4a, or may have reverse-conducting type impurities, however, the conducting type must be opposite that of the semiconductor substrate 2.

Figure 12A:
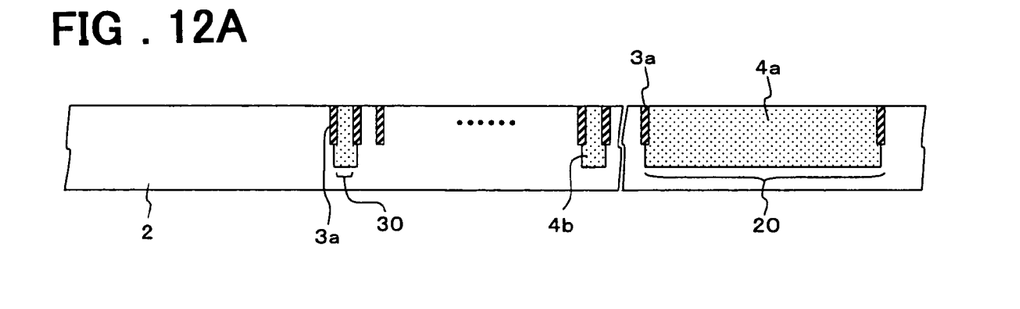
FIGS. 12A and 12B are partial cross-sectional views of a first process showing the manufacturing method of the semiconductor device of the second embodiment of the invention.
Figure 12B:
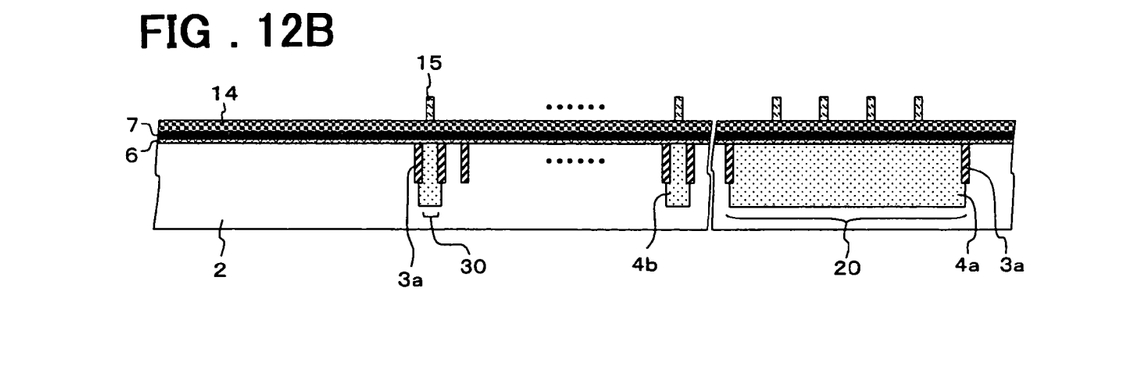
Figure 13A:
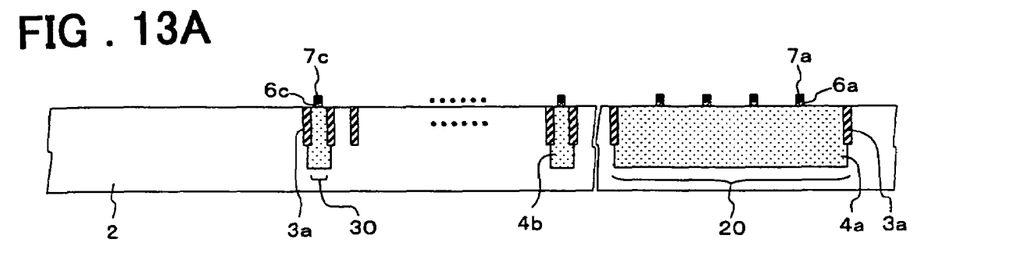
FIGS. 13A and 13B are partial cross-sectional views of a second process showing the manufacturing method of the semiconductor device of the second embodiment of the invention.
Figure 13B:
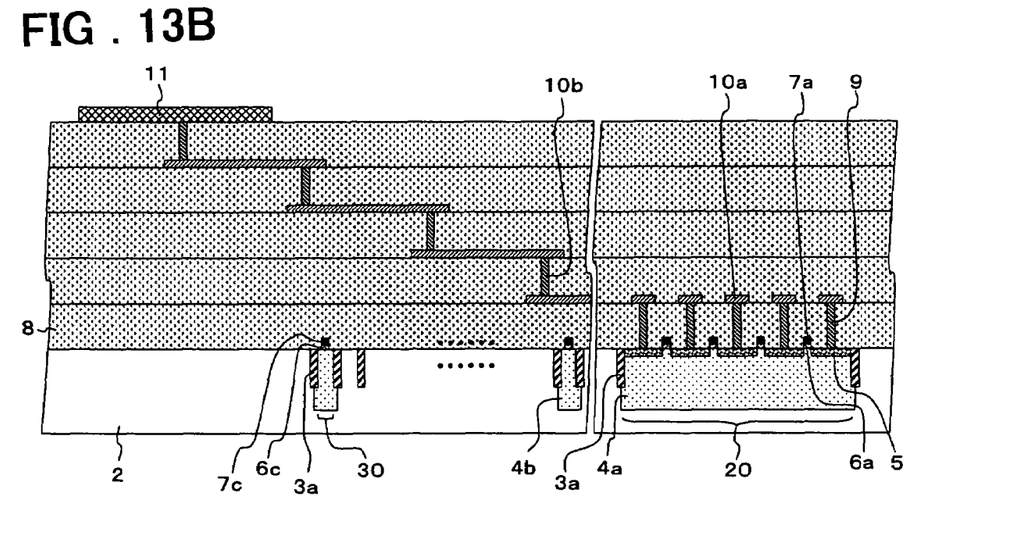

Next, the method for manufacturing the semiconductor device of this second embodiment will be explained using the drawings. FIGS. 12 and 13 are partial cross-section views that show the process steps of the method for manufacturing the semiconductor device of the second embodiment of this invention. FIGS. 12 and 13 show a cross section that corresponds to the section A-A' in FIG. 1, however, for convenience, they show a cross section corresponding to section C-C' in FIG. 1 for the protection-element area 20.

First, for the substrate that was obtained by the same process steps as in steps A1 to A4 of the first embodiment (see FIG. 5 and FIG. 6), the insulating film (see 3 in FIG. 6B) on the surface of the silicon-oxide/nitride film (see 12 in FIG. 6B) and the semiconductor substrate 2 (for example, P-type silicon substrate) is completely removed, and by implanting impurities, wells 4a, 4b, having a conductance type that is opposite that of the semiconductor substrate 2 (for example, N-type wells), are formed at a specified depth in the semiconductor substrate 2 of the protection-element area 20 and dummy-element area 30 (see FIG. 12A). Here, the wells 4a, 4b are formed at the same time, however, in the case where the conductance types of the well 4a and well 4b differ, they are formed separately. For example, first, first impurities are implanted by ion implanting into the semiconductor substrate 2 with the dummy-element area 30 covered with photoresist, then second impurities that have a conductance type that is opposite that of the semiconductor substrate 2 are implanted by ion implanting into the semiconductor substrate 2 with the protection-element area 20 covered with photoresist.

Next, an insulating film 6 to be used for forming gate-insulating film is formed on the surface of the semiconductor substrate 2, a gate layer 7 (polysilicon) to be used as gate material is formed on the top of the insulating film 6, an anti-reflection film 14 is formed on the top of the gate layer 7, and furthermore, photoresist 15 to be used for forming gate and dummy patterns is formed on the top of the anti-reflection film 14 (see FIG. 12B). When doing this, a plurality of sections of photoresist 15 (here there are four sections) to be used for forming gate patterns are arranged in a row on the top of the protection-element area 20, and photoresist 15 to be used for forming dummy patterns is arranged on specified dummy-element areas 30. Here, the photoresist 15 is arranged on the top of part of the dummy-element area 30, however, it is possible to arrange photoresist 15 on the entirety of the dummy-element area 30.

Next, using the photoresist (see 15 in FIG. 12B) as a mask, the anti-reflection film (see 14 in FIG. 12B), gate layer (see 7 in FIG. 12B) and insulating layer (see 6 in FIG. 12B) are etched in that order, and by removing the anti-reflection film 14, the gates 7a, dummy patterns 7c, gate-insulating film 6a and dummy-insulating film 6c are formed (see FIG. 13A).

Next, using the same process steps as A7 to A9 in embodiment 1, the diffusion layers 5 are formed, after which the formation of the wiring layer 10a, interlayer-insulating film 8, via hole and via 10b is repeated, and finally, the pad 11 is formed on the top of the via 10b and interlayer-insulating film 8 of the uppermost layer (see FIG. 13B).

With this second embodiment, parasitic capacity is formed between the well 4b and semiconductor substrate 2 in the dummy-element area 30, so surges are alleviated, and it is possible to obtain good resistance to electrostatic discharge.

Embodiment 3

Figure 14:
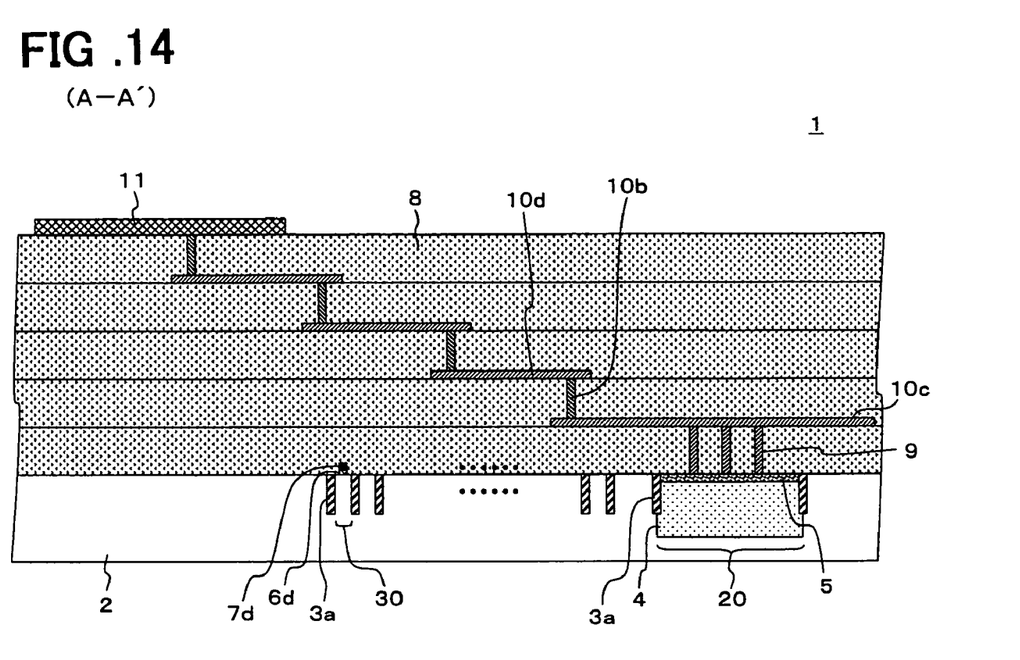
FIG. 14 is a partial cross-section view (corresponding to section A-A' in FIG. 1) showing the construction of the semiconductor device of a third embodiment of the invention.

Next, the semiconductor device of a third embodiment of the invention will be explained using the drawings. FIG. 14 is a partial cross-sectional view showing the construction of the semiconductor device of this third embodiment of the invention. FIG. 14 is a cross-sectional view that corresponds to section A-A' in FIG. 1.

The semiconductor device 1 of this third embodiment comprises dummy patterns 7d that are made from a gate layer and located on the top of the semiconductor substrate 2, and are shaped such that they are disposed inside the surface shape of the semiconductor substrate 2 in a specified dummy-element area. Here, the surface shape of the semiconductor substrate is the shape of the semiconductor substrate 2 as seen from the direction normal to the plane of the substrate. The dummy patterns 7d are located on an underlayer that includes an area directly below (i.e. area projected below) the wiring layers 10d (each of the wiring layers from two layers or more from the bottom) on a layer above the undermost wiring layer 10c. Here, it is presumed that the distance from the surface of the semiconductor substrate 2 to the undermost wiring layer 10c (bottom surface) is less than 0.7 µm, so there are no dummy patterns directly below the undermost wiring layer 10c, however, in the case where the distance from the surface of the semiconductor substrate 2 to the undermost wiring layer 10c (bottom surface) is 0.7 µm or greater, it is possible to have dummy patterns on an underlayer that includes an area directly below the undermost wiring layer 10c. The other construction is the same as that in embodiment 1.

Here, in nearly all cases tested in which the distance from the surface of the semiconductor substrate 2 to the undermost wiring layer 10c (bottom surface) was approximately 0.5 µm, breakdown of the interlayer-insulating film occurred, however, in nearly all the cases tested in which that distance was 0.7 µm, the breakdown of the interlayer-insulating film did not occur. Therefore, it is preferred that that distance be 1 µm or greater. The breakdown voltage of oxide film is typically said to be 10 MV/cm to 20 MV/cm. The breakdown voltage in the case where the distance from the surface of the substrate to the undermost wiring layer (first metal layer) obtained from desktop calculation was in the range (10 MV/cm to 20 MV/cm)×0.4 µm=400 V to 800 V (where MV is megavolts). In the measurement results, before the electrostatic discharge protection elements 21 completely functioned, the voltage at which the interlayer film (0.4 µm thick) suffered breakdown was between 500 V to 900 V, which very closely matched the calculated value. At voltages greater than this, the electrostatic protection elements functioned and it was possible to clamp the surge. The same calculation of the breakdown voltage for when the interlayer film is 0.7 µm was performed and found to be 700 V to 1400 V. Therefore, since it is possible for the electrostatic protection elements 21 to clamp the surge before the interlayer film breakdown, it becomes difficult for breakdown to occur when the interlayer film is thick.

Figure 15A:
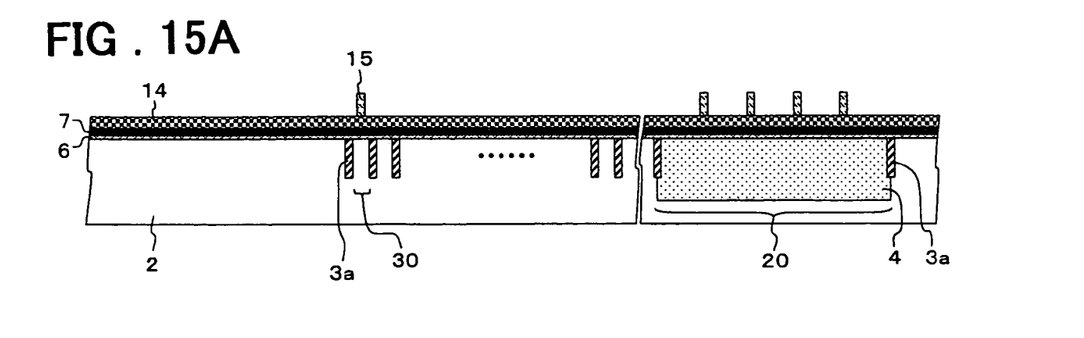
FIGS. 15A and 15B are partial cross-sectional views of a first process showing the manufacturing method of the semiconductor device of the third embodiment of the invention.
Figure 15B:
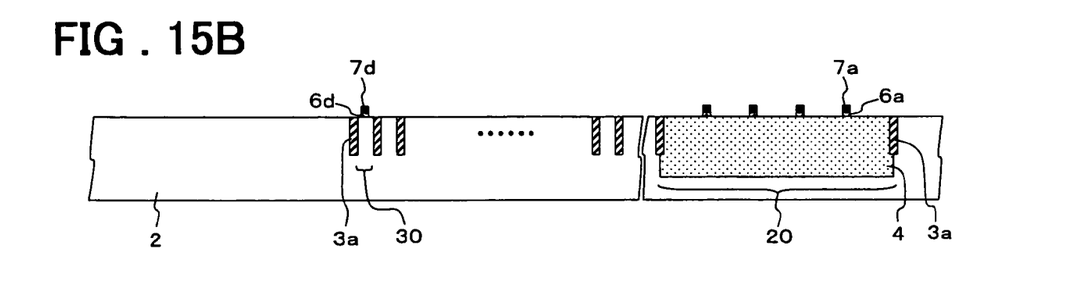
Figure 16:
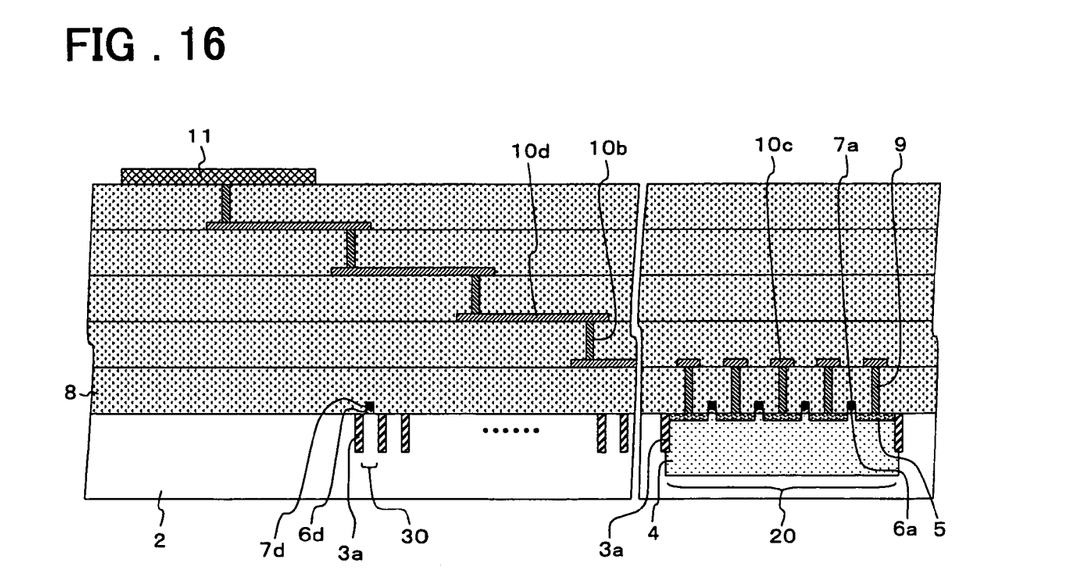
FIG. 16 is a partial cross-sectional view of a second process showing the manufacturing method of the semiconductor device of the third embodiment of the invention.

The method for manufacturing the semiconductor device of this third embodiment will be explained using the drawings. FIGS. 15 and 16 are partial cross-section views of processes that show the method for manufacturing the semiconductor device of this third embodiment of the invention. FIGS. 15 and 16 shows a cross section that corresponds to the section A-A' in FIG. 1, however, for convenience, they show a cross section that corresponds to section C-C' in FIG. 1 for the protection-element area 20.

First, for the substrate obtained by the same processes in steps A1 to A5 in the first embodiment (see FIG. 5, 6 and 7A), insulating film 6 to be used for forming the gate-insulating film is formed on the surface of the semiconductor substrate 2, a gate layer 7 (polysilicon) to be used as the gate material is formed on the top of the insulating film 6, an anti-reflection film 14 is formed on the top of the gate layer, and furthermore, photoresist 15 to be used for forming gates and dummy patterns is formed on the top of the anti-reflection film 14 (see FIG. 15A). When doing this, a plurality of sections (here there are four sections) of photoresist to be used for forming gate patterns are arranged in a row on the top of the protection-element area 20, and photoresist 15 to be used for forming dummy patterns is arranged on the top of a specified dummy-element area 30. In the future it will become necessary not to arrange photoresist 15 on the top of the dummy-element area 30 in case where the distance from the surface of the semiconductor substrate 2 to the wiring layer (not shown in the figures) is less than 0.7 µm.

Next, using the photoresist (see 15 in FIG. 15A) as a mask, the anti-reflection film (see 14 in FIG. 15A), gate layer (see 7 in FIG. 15A), and insulating film (see 6 in FIG. 15A) are etched in that order, and by removing the anti-reflection film 14, the gates 7a, dummy patterns 7d, gate-insulating film 6a and dummy-insulating film 6d are formed (see FIG. 15B).

Next, by the same processes as in steps A7 to A9 in the first embodiment, the diffusion layers 5 are formed, interlayer-insulating film 8 is formed, a contact hole is formed and contact 9 is formed, after which, the formation of the wiring layers 10c and 10d, interlayer-insulating film 8, via hole and via 10b is repeated, and finally, the pad 11 is formed on the top of a via 10b and interlayer-insulating film 8 of the uppermost layer (see FIG. 16).

With the third embodiment, dummy patterns are located in positions where it is possible to maintain the spacing between the wiring and semiconductor substrate, so surges are alleviated and it is possible to obtain good resistance to electrostatic discharge.

Embodiment 4

Figure 17:
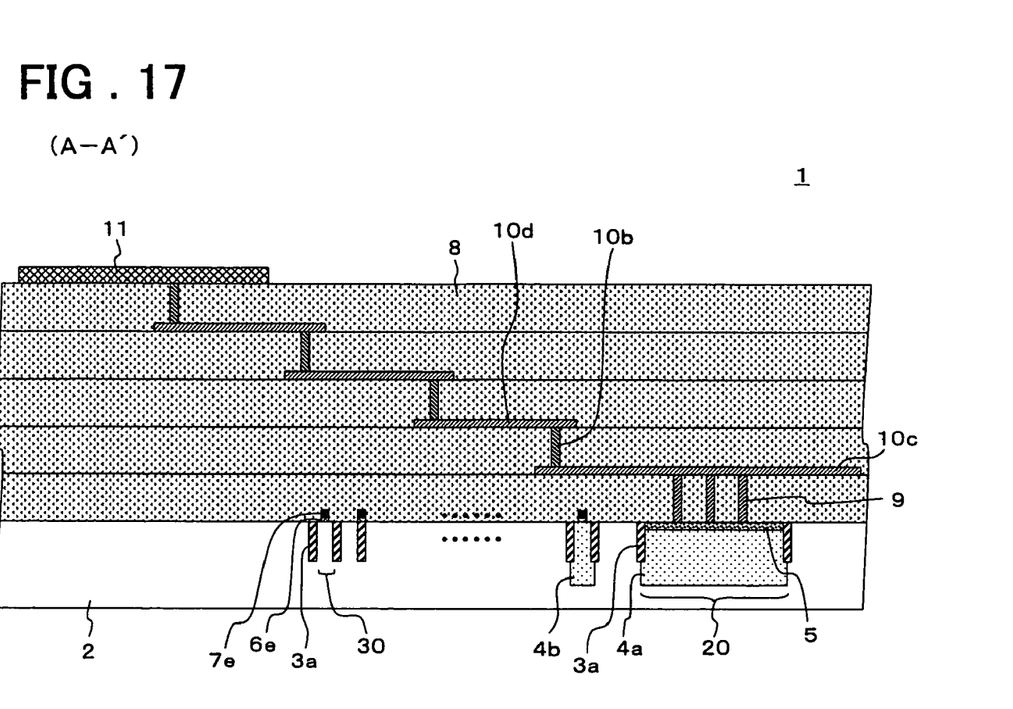
FIG. 17 is a partial cross-section view (corresponding to section A-A' in FIG. 1) showing the construction of the semiconductor device of a fourth embodiment of the invention.

The semiconductor device of a fourth embodiment of the invention will be explained using the drawings. FIG. 17 is a partial cross-sectional view that shows the construction of the semiconductor device of this fourth embodiment of the invention. FIG. 17 is a cross-sectional view that corresponds to the section A-A' in FIG. 1.

The semiconductor 1 of the fourth embodiment comprises dummy patterns 7e that are located in part of the areas other than areas where dummy patterns are prohibited. Here, as seen from the direction normal to the plane, the areas where dummy patterns are prohibited include the following area(s), among areas of the entire gate layer that will become gates 7a and dummy patterns 7e: area(s) directly under the undermost wiring layer 10c (in case where wiring layer is separated from the surface of the semiconductor substrate by a distance less than 0.7 µm) from among the wirings in which a plurality of wiring layers 10c, 10d are connected by via 10b: said area(s) excluding (a) area directly above the element-isolation areas 3a (insulator thereof), and (b) area directly above the well 4b having a conductance type opposite that of the semiconductor substrate 2. For example, certain areas that are areas where dummy patterns are not prohibited include, for instance, (a) areas directly above the element-isolation areas 3a, (b) areas directly above the well 4b, (c) areas directly under (i.e. under the projection area of) the wiring layers 10d on layers above the undermost wiring layer 10c and directly above the semiconductor substrate 2, (d) areas directly under the undermost wiring layer 10c that is separated from the surface of the semiconductor substrate 2 by a distance greater than 0.7 µm, (e) areas other than the area directly under the wiring layers 10c and 10d, etc. The dummy patterns 7e can also be located such that they cover a plurality of areas that are not areas where dummy patterns are prohibited. The other construction is the same as that in the first embodiment.

With this fourth embodiment, even when there are electrostatic discharge surges to the pad, breakdown of the interlayer-insulating film between the dummy gates and the wiring is prevented, so it is possible to obtain good resistance to electrostatic discharge.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
    a gate layer;
    dummy gate patterns,
    wherein said dummy gate patterns are located in locations, from among the entire gate layer area, located directly under an undermost wiring layer of a plurality of wiring layers located higher than said gate layer, or directly under wiring of a wiring layer that is separated from a surface of a semiconductor substrate by a distance of less than 0.7 µm, and
    wherein said dummy gate patterns are provided at locations that are directly above an insulating material of an element-isolation area, and directly above an insulating material of a well having a conductance type opposite that of said semiconductor substrate.

2. The semiconductor device of claim 1, wherein said wiring is electrically connected to an electrostatic-discharge-protection element.

3. The semiconductor device of claim 1, further comprising an underlayer, said underlayer comprising a dummy isolation film provided between the dummy gate patterns and the semiconductor substrate.

* * * * *